United States Patent
Arsovski et al.

(10) Patent No.: US 9,058,903 B2
(45) Date of Patent: Jun. 16, 2015

(54) METHODS AND CIRCUITS FOR DISRUPTING INTEGRATED CIRCUIT FUNCTION

(71) Applicant: International Business Machines Corporation, Armonk, NY (US)

(72) Inventors: Igor Arsovski, Williston, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 13/742,733

(22) Filed: Jan. 16, 2013

(65) Prior Publication Data

US 2014/0201579 A1   Jul. 17, 2014

(51) Int. Cl.
 *G11C 29/00* (2006.01)
 *G11C 29/56* (2006.01)
 *G11C 29/42* (2006.01)
 *G11C 29/52* (2006.01)

(52) U.S. Cl.
 CPC ............. *G11C 29/56* (2013.01); *G11C 29/42* (2013.01); *G11C 29/52* (2013.01)

(58) Field of Classification Search
 CPC ........ G11C 29/56; G11C 29/40; G11C 29/44; G11C 29/10; H05K 999/99

USPC .......................................................... 714/719
 See application file for complete search history.

(56) References Cited

U.S. PATENT DOCUMENTS

| | | | |
|---|---|---|---|
| 5,477,548 A * | 12/1995 | Beenker et al. ............... | 714/727 |
| 6,553,496 B1 | 4/2003 | Buer | |
| 6,665,161 B1 | 12/2003 | Brady et al. | |
| 6,782,479 B1 | 8/2004 | Williams et al. | |
| 6,794,733 B1 | 9/2004 | Brady et al. | |
| 6,909,159 B2 | 6/2005 | Friend et al. | |
| 6,969,859 B2 | 11/2005 | Klaasen et al. | |
| 7,880,340 B2 | 2/2011 | Miller | |
| 8,130,008 B2 | 3/2012 | Kuenemund | |
| 8,149,012 B2 | 4/2012 | Lazaravich et al. | |
| 2011/0055646 A1 * | 3/2011 | Mukherjee et al. ........... | 714/719 |

* cited by examiner

*Primary Examiner* — Albert Decady
*Assistant Examiner* — Enam Ahmed
(74) *Attorney, Agent, or Firm* — Schmeiser, Olsen & Watts; David Cain

(57) ABSTRACT

Methods and circuits for disrupting integrated circuit function. The circuits include finite state machines connected to memory arrays. The finite state machines are sensitive to a predetermined sequence of addresses sent to the memory array or the time between a series of memory array errors detected by an error detection circuit. Upon detection of the pre-set addresses or errors the finite state machines either (i) enable or disable specific circuit functions or (ii) disrupt the operation of the integrated circuit.

24 Claims, 4 Drawing Sheets

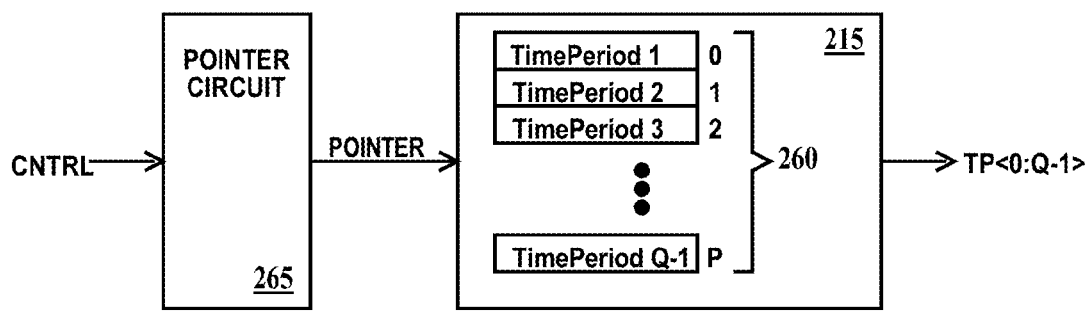
*FIG. 6*
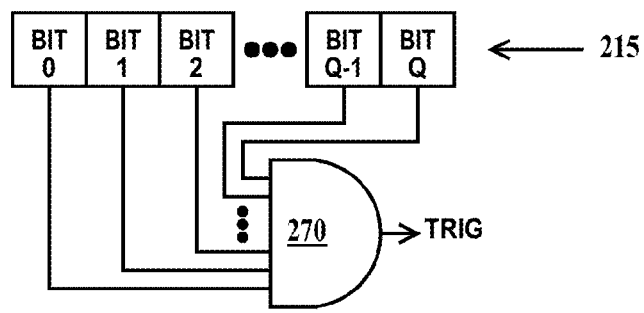
*FIG. 7*
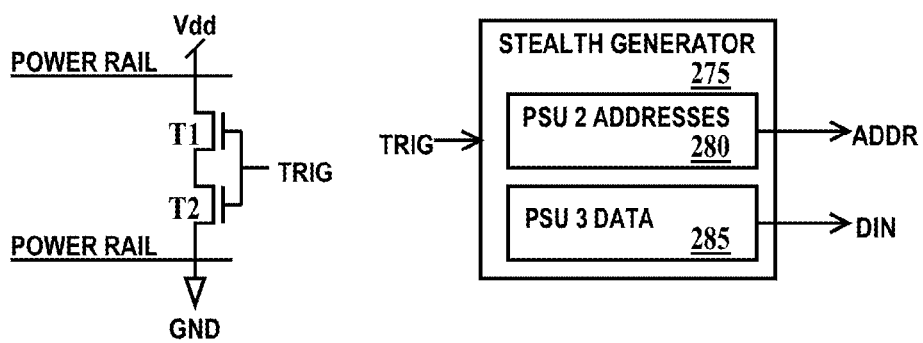
*FIG. 8*             *FIG. 9*

METHODS AND CIRCUITS FOR DISRUPTING INTEGRATED CIRCUIT FUNCTION

TECHNICAL FIELD

The present invention relates to the field of integrated circuits; more specifically, it relates to methods and circuits for disrupting the normal operation of integrated circuits.

BACKGROUND

For security and other reasons there is a need to enable/disable the functions of integrated circuits in the field. Present methods require physical contact to the integrated circuit chip or employ software means, both of which are relatively easy to prevent or detect. Accordingly, there exists a need in the art to mitigate the deficiencies and limitations described hereinabove.

BRIEF SUMMARY

A first aspect of the present invention is a method, comprising: providing an integrated circuit, comprising: an address decoder connected to a memory cell array; a finite state machine connected to an address input connected to the address decoder; a pattern signature unit connected to the finite state machine; and the finite state machine including an address compare circuit and including a trigger signal generation circuit; reading consecutive memory cell addresses on the address input; comparing memory cell addresses of the memory cell array on the address input to pre-set addresses in the pattern signature unit; and generating a trigger signal when addresses of a preset number of memory addresses match respective addresses encoded or stored in the pattern signature unit.

A second aspect of the present invention is a method, comprising: providing an integrated circuit comprising: an address decoder connected to a memory cell array; an error detector connected between the memory cell array and an electronic error correction circuit, the electronic error correction circuit connected to the memory cell array; a finite state machine connected to the error detector; a pattern signature unit connected to the finite state machine; and the finite state machine including a time period compare circuit and including a trigger signal generation circuit; detecting memory cell array errors by the error detector; determining times between successive memory cell array errors detected by the error detector; comparing the times between successive memory cell array errors detected by the error detector to pre-set time period time values stored in the pattern signature unit; and generating a trigger signal when time values of a preset number of time periods between consecutive memory cell array errors match respective time values of time periods encoded or stored in the pattern signature unit.

A third aspect of the present invention is an integrated circuit, comprising: an address decoder connected to a memory cell array; a finite state machine connected to an address input connected to the address decoder; a pattern signature unit connected to the finite state machine; and the finite state machine including: a circuit for comparing memory cell addresses of the memory cell array on the address input to pre-set addresses encoded or stored in the pattern signature unit; and a circuit for generating a trigger signal when addresses of a preset number of memory addresses match respective addresses encoded or stored in the pattern signature unit.

A fourth aspect of the present invention is an integrated circuit, comprising: an address decoder connected to a memory cell array; an error detector connected between the memory cell array and an electronic error correction circuit, the electronic error correction circuit connected to the memory cell array; a finite state machine connected to the error detector; a pattern signature unit connected to the finite state machine; and the finite state machine including: a circuit for detecting memory cell errors in the memory cell array; a circuit for determining times between successive memory cell array errors detected by the error detector; a circuit for comparing the times between successive memory cell array errors detected by the error detector to pre-set time period time values stored in the pattern signature unit; and a circuit for generating a trigger signal when time values of a preset number of time periods between consecutive memory cell array errors match respective time values of time periods stored in the pattern signature unit.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 6 is a schematic diagram of the pointer function of the finite state machine of FIG. 4;

FIG. 7 is an exemplary schematic diagram of the register of FIG. 4;

FIG. 8 is a schematic diagram of a first exemplary disruption circuit according to an embodiment of the present invention;

FIG. 9 is a schematic diagram of a second exemplary disruption circuit according to an embodiment of the present invention;

DETAILED DESCRIPTION

The embodiments of the present invention utilize a memory array of an integrated circuit to detect a specific event sequence and in response to that sequence generate a trigger signal that is used to (i) enable or disable specific circuit functions or (ii) disrupt the operation of the integrated circuit. Disruption includes stopping integrated circuit functions, permanently preventing integrated circuit functions, and physically destroying the integrated circuit.

Figure 1:
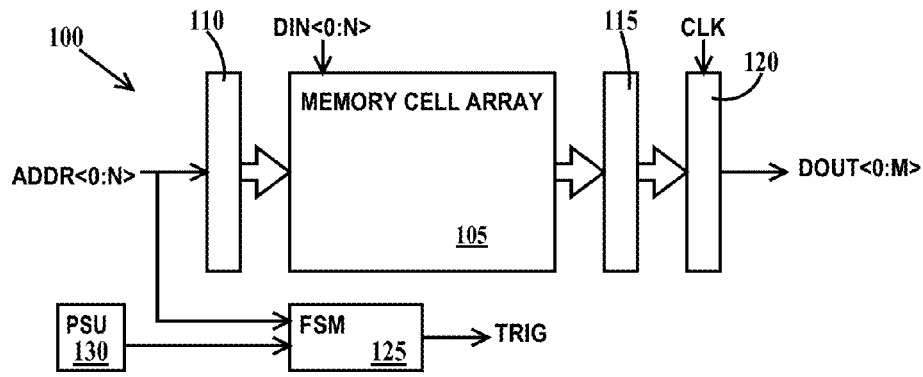
FIG. 1 is a schematic diagram of an integrated circuit according a first embodiment of the present invention.

FIG. 1 is a schematic diagram of an integrated circuit according a first embodiment of the present invention. In FIG. 1, an integrated circuit 100 includes a memory cell array 105, an address decoder 110, sense amplifiers 115 and output latches 120. During write, address decoder 110 receives an ADDR signal which is decoded to select specific memory cells of memory cell array 105 to receive input data (DIN). During read, sense amplifiers 115 amplify data stored in the memory cells of memory cell array 105 which data is then latched by output latches 120. Output data (DOUT) is read out in response to a clock signal CLK. In one example, memory array 105, address decoder 110, sense amplifiers 115 and output latches 120 are normal operating components of an integrated circuit. However, integrated circuit 100 further includes a finite state machine (FSM) 125 and a pattern signature unit (PSU) 130. In one example, PSU 130 is non-volatile memory (NVM) which stores data and does not lose the stored data when power to the integrated circuit is turned off. Examples of NVM memory include read only memory (ROM) and non-volatile random access memory (NVRAM). ROM can be implemented by hard-wiring during integrated circuit manufacture or by fuse blow. In one example, PSU 130 is a hardwired pattern signature circuit. A hardwired circuit encoding a pre-set pattern that the detected pattern is compared to is less easily detected than an NVM. FSM 125 is a set of circuits that perform the logical functions of FIG. 2. The ADDR signals received by address decoder 110 are also received by FSM 125. PSU 130 encodes or stores a list of addresses which are compared to the received ADDR signals by FSM 125. Logic circuits within FSM 125 generate a trigger signal TRIG based on the logic diagram of FIG. 2.

Figure 2:
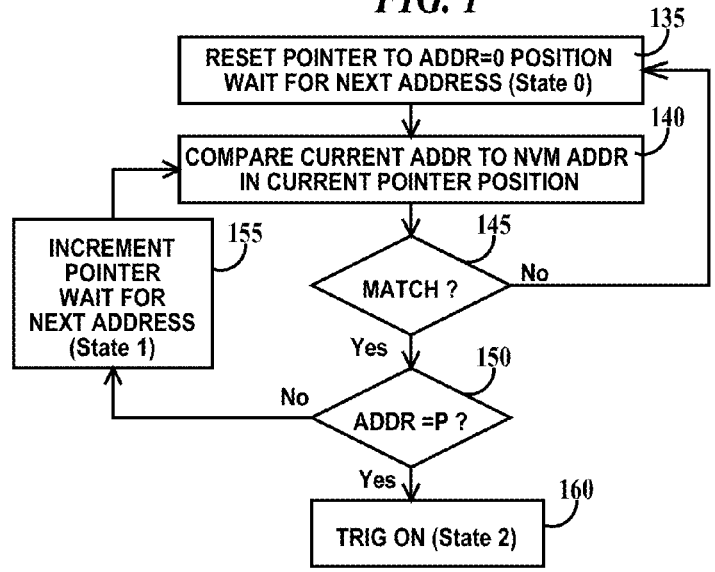
FIG. 2 is a diagram of the logic implemented by the finite state machine of FIG. 1.

FIG. 2 is a diagram of the logic implemented by FSM 125 of FIG. 1. In block 135, the pointer is set/reset to ADDR=0 (see FIG. 3) and arrival of the next ADDR is waited for. This is state 0. Upon receipt of the next address (ADDR, see FIG. 1) the logic increments to block 140. In block 140 the current address is compared to the pointer address (PADDR) in the current pointer position. In block 145, if the two addresses (ADDDR and PADDR) do not match then a loop back to block 135 occurs; otherwise, in block 150, it is determined if the current pointer address position is the last position (P). If the pointer position is not the last pointer position then the pointer is incremented to the next position and the arrival of the next ADDR is waited for. This is state 1. Upon arrival of the next ADDR a loop back to block 140 is performed. If in block 145, the current ADDR does not match the current PADDR then a loop back to block 135 (state 0) is performed. If in block 150 the current pointer address is PADDRP, then in block 160 the TRIG signal is set to on on or a TRIG signal is generated. The allowable transitions are state 0 to state 1, state 1 to state 0 and state 1 to state 2. Thus, TRIG is turned on or is generated only when a sequence of P+1 ADDRs that match the P+1 PADDRs are received in the same sequential order as stored in PSU memory 130 by FMS 125 (see FIG. 1). Any break in the received ADDRs causes a reset back to state 0.

Figure 3:
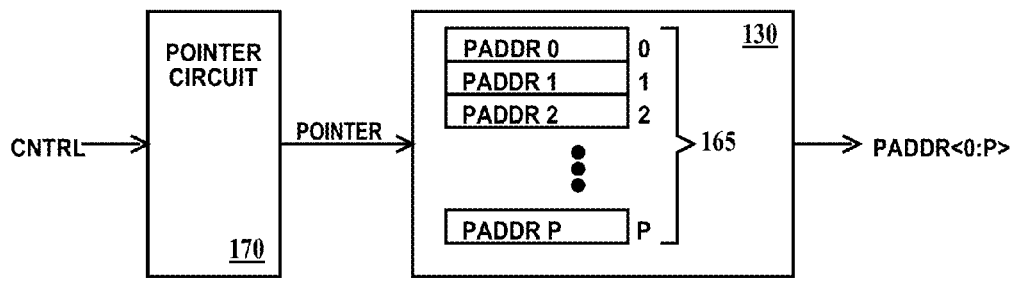
FIG. 3 is a diagram of the pointer function of the finite state machine of FIG. 2.

FIG. 3 is a diagram of the pointer function of FSM 125 of FIG. 2. In FIG. 3, a pointer address array 165 of PSU 130 includes positions 0 through P in which PADDRs O through P are stored. A pointer circuit 170 in response to a CTRL signal controls which address position is the current address position and is read out as a PDDR<0:P> signal. Pointer circuit 170 is essentially a simple address decoder. In one example, pointer circuit 170 is contained within FSM 125 and CNTRL is an internal signal. In one example, pointer circuit 170 is contained within PSU 130 and CNTRL is an external signal from FSM 125.

Thus, by sending a pre-determined sequence of memory array addresses to memory cell array 175, the TRIG signal is generated which can then be used to disrupt, destroy, disable or enable specific circuit functions (e/g., cause the integrated circuit to execute pre-programmed instructions) as in FIGS. 8 and 9 described infra. The pre-determined sequence of memory array addresses is the same as stored in PSU 130. The greater the number of stored addresses the less likely is the possibility for a random sequence of addresses generated during normal operation of the integrated circuit chip matching the stored addresses and generating an unintended TRIG signal.

Figure 4:
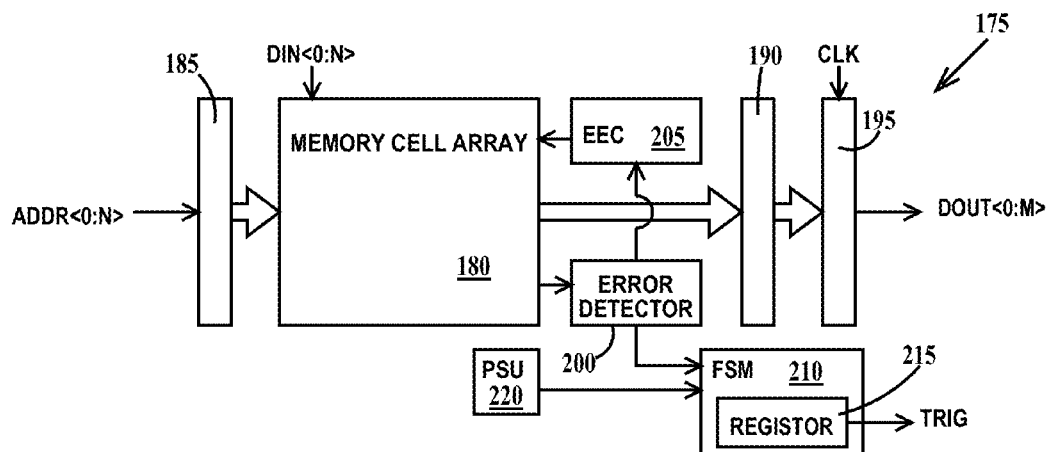
FIG. 4 is a schematic diagram of an integrated circuit according a second embodiment of the present invention.

FIG. 4 is a schematic diagram of an integrated circuit according a second embodiment of the present invention. In FIG. 4, an integrated circuit 175 includes a memory cell array 180, an address decoder 185, sense amplifiers 190, output latches 195, error detection circuit 200 and electronic error correction (EEC) circuit 205. During write, address decoder 185 receives an ADDR signal which is decoded to select specific memory cells of memory cell array 180 to receive input data (DIN). During read, sense amplifiers 190 amplify data stored in the memory cells of memory cell array 180 which data is then latched by output latches 195. Output data (DOUT) is read out in response to a clock signal CLK. When soft errors occur in memory cell array 180, error detector 200 detects the error and EEC 205 corrects the soft error by writing the correct data back into the errant memory cell(s). Soft errors are bit errors that are not caused by physical failure of a memory cell. In one example, soft errors are caused by ionizing radiation striking a transistor in a memory cell and flipping the bit (from 0 to 1 or from 1 to 0). In one example, memory array 180, address decoder 185, sense amplifiers 190, output latches 195, error detection circuit 200 and EEC 205 are normal operating components of an integrated circuit. However, integrated circuit 175 further includes a finite state machine (FSM) 210 having a register 215 and a (PSU) 220. Examples of PSU units have been given supra with respect to FIG. 1. FSM 210 is a set of circuits that perform the logical functions of FIG. 5. The time that each soft error is detected is provided to FSM 210 which is converted to a time period between the time the current soft error was detected and the timer the immediately previous soft error was detected. Soft error times may be recovered using serializer/deserializer circuit included in FSM 210. PSU 220 encodes or stores a list of time period values which are compared to the time between immediately successive error events FSM 210. Register 215 within FSM 210 generate a trigger signal TRIG based on the logic diagram of FIG. 5.

Figure 5:
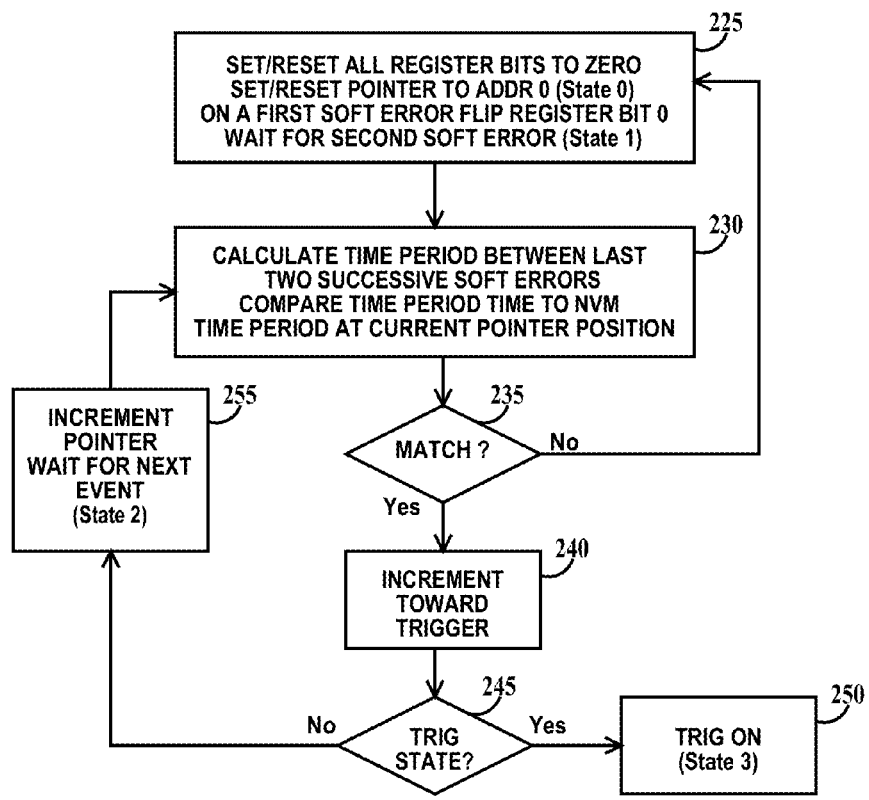
FIG. 5 is a diagram of the logic implemented by the finite state machine of FIG. 4.

FIG. 5 is a diagram of the logic implemented by FSM 210 of FIG. 4. In block 225, all bits of register 215 are set to 0 (see FIGS. 2 and 7) and the pointer is set/reset to ADDR=0 (see FIG. 6) and occurrence of consecutive first and second soft error events is waited for. This is state 0. On occurrence of the first soft error event register bit 0 is flipped. This is state 1. Upon occurrence of a second soft error event the logic increments to block 230. In block 230, the time period between the last two consecutive soft error events is calculated and in block 235 the calculated time period is compared to the time period at the register address that the pointer is currently set to. If the calculated and stored time periods do not match then a loop back to block 225 occurs otherwise the FSM increments toward the trigger state (when a register is used, the next bit of register 215 is flipped in block 240 and if in block 245 it is determined if the FSM has reached the trigger state (when a register is used, all bits of register 215 are 1), then in block 250 TRIG is automatically generated. This is state 3. If all bits of register 215 are not 1 in block 244 then in block 255 the pointer is incremented to the next position and the occurrence of the next soft error is waited for. This is state 2. Upon occurrence of the next soft error event a loop back to block 230 is performed. The allowable transitions are state 0 to state 1, state 1 to state 0, and state 1 to state 2, state 2 to state 1 and state 2 to state 3. Thus, TRIG is turned on or is generated by FSM 210 (see FIG. 4) only when a sequence of Q soft error events are generated predetermined time periods apart that match the Q−1 time periods in the order stored in PSU memory 220. Any mismatch in the time periods between consecutive soft error events and the corresponding stored time period causes a reset back to state 0.

FIG. 6 is a schematic diagram of the pointer function of FSM 210 of FIG. 4. In FIG. 6, a pointer address array 260 of PSU 220 includes address positions 0 through Q−1 in which Time Periods 0 through Q−1 are stored. A pointer circuit 265 in response to a CTRL signal from FSM 210 controls which address position is the current address position and is read out as a TP,0:Q−1> signal. Pointer circuit 265 is essentially a simple address decoder. In one example, pointer circuit 265 is contained within FSM 210 and CNTRL is an internal signal. In one example, pointer circuit 265 is contained within PSU 220 and CNTRL is an external signal from FSM 210.

FIG. 7 is an exemplary schematic diagram of register 215 of FIG. 4. In FIG. 7, register 215 includes Q bits. There is one more bit position in register 215 than addresses in PSU 215. The output of each bit of register 215 is connected to a corresponding input of a Q input AND gate 270. The output of AND gate 270 is the TRIG signal. The reset state of register 215 is all bits 0 and flipping a bit flips a bit from 0 to 1. When all bits 0 through Q are 1, TRIG is 1.

Thus, by causing (for example, by generating a series of ionizing radiation events) a pre-determined time-dependent sequence of soft errors to memory array 180, memory cell array 180, the TRIG signal is generated which can then be used to destroy, disable or cause the integrated circuit to execute pre-programmed instructions as in FIGS. 8 and 9 described infra. In one example, the pre-determined time-dependent sequence of soft errors are generated by directing a time-dependent sequence of high energy particle pulses (e.g., alpha, beta or gamma particles) to memory cell array 180, wherein memory cell array acts as an antenna for these pulse. The time between successive pulses is the same as the time periods stored in PSU 220. The greater the number of stored time periods the less likely is the possibility for a random sequence of soft error events during normal operation of the integrated circuit chip matching the stored time periods and generating an unintended TRIG signal.

FIG. 8 is a schematic diagram of a first exemplary disruption circuit according to an embodiment of the present invention. In FIG. 8, n-channel field effect transistors (NFETs) T1 and T2 are connected in series between a first integrated circuit power rail connected to Vdd and a second integrated circuit power rail connected to GND. The drain of T1 is connected to Vdd, the source of NFET T1 is connected to the drain of NFET T2 and the source of NFET T2 is connected to GND. The gates of NFETS T1 and T2 are connected to TRIG. A 1 on TRIG cause NFETS T1 and T2 to turn on and a short between Vdd and GND to occur which will cause un-repairable damage to the integrated circuit. Two NFETS are shown to reduce the possibility of a false destruction in the event of a false trigger of one of the NFETs. However, one NFET or more than two NFETS may be used. Multiple destruction means may be placed in multiple locations in the integrated circuit chip.

FIG. 9 is a schematic diagram of a second exemplary disruption circuit according to an embodiment of the present invention. In FIG. 9, a stealth generator 275 includes a second PSU 280 encoding or storing pre-set memory addresses and a third PSU 285 encoding or storing data. In response to TRIG, the data in PSU 285 is written into addresses encoded or stored in PSU 280 of a memory array of the integrated circuit in place of the data normally written. The encoded or stored data may cause, for example, chip malfunctions, unexpected chip functions, program changes and the sending of information to predetermined IP addresses.

Figure 10:
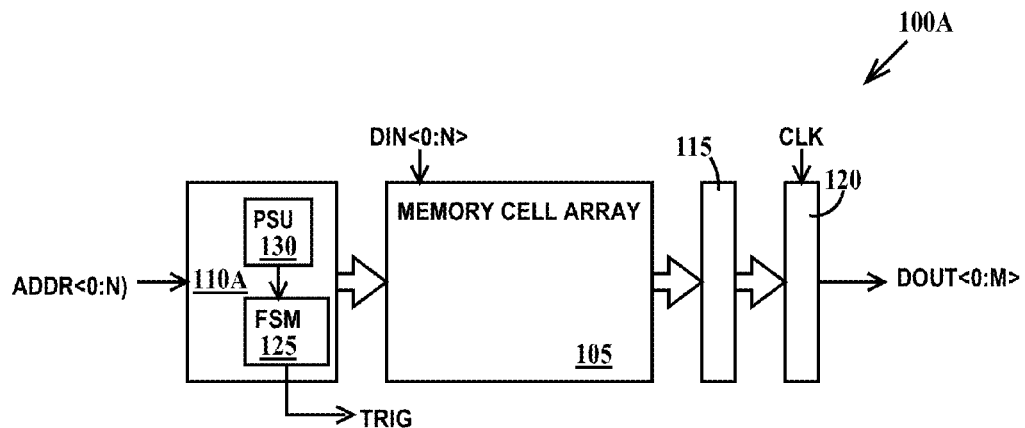
FIG. 10 is an alternate configuration of the integrated circuit of FIG. 1.

FIG. 10 is an alternate configuration of the integrated circuit of FIG. 1. The difference between integrated circuit 100A of FIG. 10 and integrated circuit 100 of FIG. 1 is that in FIG. 10, PSU 130 and FSM 125 are interwoven into address decoder 110A. That is, the devices and wiring corresponding to PSU 130 and FSM 125 are placed in the same region of the integrated circuit chip as the devices and wiring corresponding to the address decoder function. This makes it more difficult to detect PSU 130 and FSM 125. Alternatively, FSM 125 may be interwoven into the address decoder and PSU 130 placed in another region of the integrated circuit chip. In one example, PSU 125 is interwoven into memory cell array 105.

Figure 11:
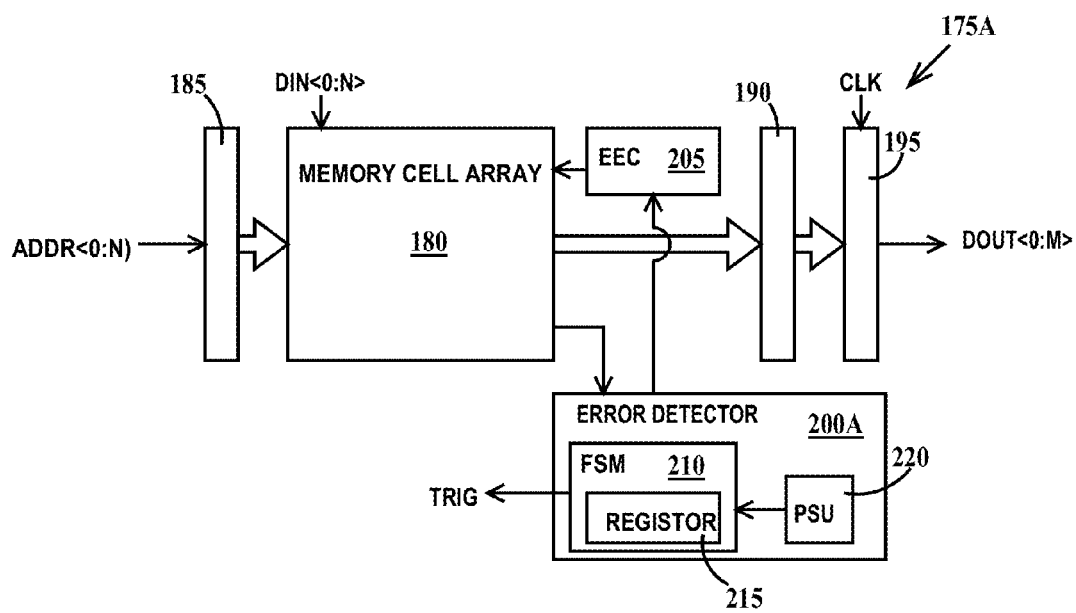
FIG. 11 is an alternate configuration of the integrated circuit of FIG. 4.

FIG. 11 is an alternate configuration of the integrated circuit of FIG. 4. The difference between integrated circuit 175A of FIG. 11 and integrated circuit 175 of FIG. 4 is that in FIG. 11, PSU 220 and FSM 210 are interwoven into error detector 200A. That is, the devices and wiring corresponding to PSU 220 and FSM 210 are placed in the same region of the integrated circuit chip as the devices and wiring corresponding to the error detection function. This makes it more difficult to detect PSU 220 and FSM 210. Alternatively, FSM 210 may be interwoven into the error detector and PSU 220 placed in another region of the integrated circuit chip. In one example, PSU 210 is interwoven into memory cell array 180.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   providing an integrated circuit, comprising:
      an address decoder connected to a memory cell array;
      a first input of a finite state machine connected to an address input of said address decoder;
      a pattern signature unit connected to a second input of said finite state machine; and
      said finite state machine including an address compare circuit and including a trigger signal generation circuit;
   said finite state machine reading consecutive memory cell addresses on said address input;
   using said address compare circuit, comparing memory cell addresses of said memory cell array on said address input to pre-set addresses in said pattern signature unit; and
   said finite state machine generating a trigger signal when addresses of a preset number of memory addresses match respective addresses encoded or stored in said pattern signature unit.

2. The method of claim 1, wherein said finite state machine includes a pointer circuit configured to select a pointer address encoded or stored in said pattern signature unit and configured to compare said selected pointer address to a current memory cell address on said address input.

3. The method of claim 2, wherein state machine comprises:

a first state with said pointer circuit pointing to a first pointer address encoded or stored in said pattern signature unit;

a second state with said pointer circuit pointing to a pointer address encoded or stored in said pattern signature unit other than said first pointer address or a last pointer address;

a third state with said pointer circuit pointing to a last pointer address stored in said pattern signature unit and a trigger signal turned on; and wherein said finite state machine is configured to transition to said third state only when all pointer addresses in the order the pointer addresses are encoded or stored in said pattern signature unit have matched consecutive memory cell addresses in the order the memory cell addresses were received by said finite state machine.

4. The method of claim 1, wherein, upon a disruption circuit receiving said trigger signal from said finite state machine, said disruption circuit (i) shorts power rails of said integrated circuit together or (ii) writes pre-stored data to pre-stored addresses of said memory cell array.

5. The method of claim 1, wherein said pattern signature unit is non-volatile memory storing memory addresses or a hardwired pattern signature circuit storing said memory addresses.

6. The method of claim 1, further including:
sending a set of memory cell addresses from a first memory cell address to a last memory cell address from said pattern signature unit to said finite state machine, each memory cell address of said set of memory cell addresses matching the order and values of pointer addresses encoded or stored in said pattern signature unit, there being a same number of pointer addresses stored in said pattern signature unit as there are memory cell addresses in said set of memory cell addresses.

7. A method, comprising:
providing an integrated circuit comprising:
an address decoder connected to a memory cell array;
an error detector connected to said memory cell array and to an electronic error correction circuit, said electronic error correction circuit connected to said memory cell array and configured to correct soft memory cell errors;
a first input of a finite state machine connected to an output of said error detector;
a pattern signature unit connected to a second input of said finite state machine;
said finite state machine including a time period compare circuit configured to compare times between successive soft error fails and times stored in times stored in said finite state machine; and
said finite state machine including a trigger signal generation circuit;
detecting soft memory cell errors in said memory array unit by said error detector;
determining times between successive soft memory cell errors detected by said error detector;
comparing said times between successive soft memory cell errors detected by said error detector to pre-set time period time values stored in said pattern signature unit; and
generating a trigger signal when time values of a preset number of time periods between consecutive soft memory cell errors match respective time values of time periods encoded or stored in said pattern signature unit.

8. The method of claim 7, wherein said finite state machine includes a pointer circuit configured to select a pointer time period time value encoded or stored in said pattern signature unit and configured to compare said selected pointer time period time value to a difference in time between two consecutive soft memory cell errors.

9. The method of claim 8, wherein state machine comprises:
a first state with said pointer circuit pointing to a first pointer time period time value stored in said pattern signature unit;
a second state with said pointer circuit pointing to a pointer time period time value stored in said pattern signature unit other than said first pointer time period time value or a last pointer time period time value;
a third state with said pointer circuit pointing to a last pointer time period time value of said pattern signature unit and a trigger signal turned on; and
said finite state machine transitioning to said third state only when all pointer time period time values in the order the pointer time period time values are stored in said pattern signature unit have matched consecutive and respective time period time differences between soft memory cell errors in the order the soft memory cell errors were detected.

10. The method of claim 7, wherein, upon a disruption circuit receiving said trigger signal from said finite state machine, said disruption circuit (i) shorts power rails of said integrated circuit together or (ii) writes pre-stored data to pre-stored addresses of said memory cell array.

11. The method of claim 7, wherein said pattern signature unit is non-volatile memory storing memory addresses or a hardwired pattern signature circuit storing said memory addresses.

12. The method of claim 7, further including:
generating a set of radiation events from a first radiation event to a last radiation event, each radiation event of said set of radiation events generating a corresponding memory cell array error; said radiation events spaced respective time periods apart, said respective time periods matching the order and time values of pointer time periods stored in said non-volatile memory, there being one more event than time periods encoded or stored in said pattern signature unit.

13. An integrated circuit, comprising:
an address decoder connected to a memory cell array;
a first input of a finite state machine connected to an address input of said address decoder;
a pattern signature unit connected to a second input of said finite state machine, said pattern signature unit encoding or storing pre-set memory cell addresses; and
said finite state machine including:
a circuit configured to compare memory cell addresses of said memory cell array on said address input to said pre-set memory addresses encoded or stored in said pattern signature unit; and
a circuit configured to generate a trigger signal when addresses of a preset number of memory addresses on said address input match respective pre-set memory cell addresses encoded or stored in said pattern signature unit.

14. The integrated circuit of claim 13, wherein said finite state machine includes a pointer circuit configured to select a pointer address encoded or stored in said pattern signature unit and configured to compare said selected pointer address to a current memory cell address on said address input.

15. The integrated circuit of claim 14, wherein state machine comprises:

a first state with said pointer circuit pointing to a first pointer address encoded or stored in said pattern signature unit;

a second state with said pointer circuit pointing to a pointer address encoded or stored in said pattern signature unit other than said first pointer address or a last pointer address;

a third state with said pointer circuit pointing to a last pointer address encoded or stored in said pattern signature unit and a disrupt signal turned on; and wherein said finite state machine is configured to transition to said third state only when all pointer addresses in the order the pointer addresses are encoded or stored in said pattern signature unit have matched consecutive memory cell addresses in the order the memory cell addresses were received by said finite state machine.

16. The integrated circuit of claim 13, including:

a disruption circuit configured to receive said trigger signal from said finite state machine and (i) comprising a circuit configured to short power rails of said integrated circuit together or (ii) comprising a circuit configured to write pre-stored data to pre-stored addresses of said memory cell array.

17. The integrated circuit of claim 13, wherein devices and wiring of said finite state machine are located in a same region of said integrated circuit as said address decoder.

18. The integrated circuit of claim 13, wherein said pattern signature unit is non-volatile memory storing memory addresses or a hardwired pattern signature circuit storing said memory addresses.

19. An integrated circuit, comprising:

an address decoder connected to a memory cell array;

an error detector connected to said memory cell array and to an electronic error correction circuit, said electronic error correction circuit connected to said memory cell array and configured to correct soft memory cell errors;

a first input of a finite state machine connected to an output of said error detector;

a pattern signature unit connected to a second input of said finite state machine; and said finite state machine including:

a circuit for detecting soft memory cell errors in said memory cell array;

a circuit configured to determine times between successive soft memory cell array errors detected by said error detector;

a circuit configured to compare said times between successive soft memory cell errors detected by said error detector to pre-set time period time values stored in said pattern signature unit; and a circuit configured to generate a trigger signal when time values of a preset number of time periods between consecutive soft memory cell errors match respective time values of time periods stored in said pattern signature unit.

20. The integrated circuit of claim 19, wherein said finite state machine includes a pointer circuit configured to select a pointer time period time value encoded or stored in said pattern signature unit and configured to compare said selected pointer time period time value to a difference in time between two consecutive soft memory cell errors.

21. The integrated circuit of claim 20, wherein state machine comprises:

a first state with said pointer circuit pointing to a first pointer time period time value encoded or stored in said pattern signature unit;

a second state with said pointer circuit pointing to a pointer time period time value encoded or stored in said pattern signature unit other than said first pointer time period time value or a last pointer time period time value;

a third state with said pointer circuit pointing to a last pointer time period time value of encoded or stored in said pattern signature unit and a trigger signal turned on; and wherein said finite state machine is configured to transition to said third state only when all pointer time period time values in the order the pointer time period time values are encoded or stored in said pattern signature unit have matched consecutive and respective time period time differences between memory cell arrays in the order the memory cell array errors were detected.

22. The integrated circuit of claim 19, including:

a disruption circuit configured to receive said trigger signal from said finite state machine and (i) comprising a circuit configured to short power rails of said integrated circuit together or (ii) comprising a circuit configured to write pre-stored data to pre-stored addresses of said memory cell array.

23. The integrated circuit of claim 18, wherein devices and wiring of said finite state machine are located in a same region of said integrated circuit as said address decoder.

24. The integrated circuit of claim 18, wherein said pattern signature unit is non-volatile memory storing memory addresses or a hardwired pattern signature circuit storing said memory addresses.

* * * * *